(12) United States Patent
Zhao et al.

(10) Patent No.: US 12,506,030 B2
(45) Date of Patent: Dec. 23, 2025

(54) SEMICONDUCTOR STRUCTURE AND PREPARATION METHOD OF SEMICONDUCTOR STRUCTURE

(71) Applicant: CHANGXIN MEMORY TECHNOLOGIES, INC., Hefei (CN)

(72) Inventors: Wenli Zhao, Hefei (CN); Jie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 478 days.

(21) Appl. No.: 18/150,840

(22) Filed: Jan. 6, 2023

(65) Prior Publication Data
US 2023/0238273 A1    Jul. 27, 2023

(30) Foreign Application Priority Data

Jan. 24, 2022   (CN) .......................... 202210082266.X

(51) Int. Cl.
*H01L 21/762*      (2006.01)
*H01L 21/311*      (2006.01)
(Continued)

(52) U.S. Cl.
CPC .. *H01L 21/76224* (2013.01); *H01L 21/31111* (2013.01); *H10D 62/115* (2025.01)

(58) Field of Classification Search
CPC ......... H01L 21/76224; H01L 21/31111; H01L 21/76229; H01L 21/76232; H10D 84/0188; H10D 84/85; H10D 84/038
See application file for complete search history.

(56) References Cited

U.S. PATENT DOCUMENTS 5,780,346 A * 7/1998 Arghavani ........ H01L 21/76235
                                                   438/296
5,989,978 A * 11/1999 Peidous ................ H01L 21/763
                                                  257/E21.549
(Continued)

FOREIGN PATENT DOCUMENTS

CN        101000910 A      7/2007
CN        102148181 A      8/2011
(Continued)

OTHER PUBLICATIONS

International Search Report in the international application No. PCT/CN2022/136132, mailed on Feb. 11, 2023, 5 pages.
(Continued)

*Primary Examiner* — Mohsen Ahmadi
(74) *Attorney, Agent, or Firm* — Syncoda LLC; Feng Ma

(57) ABSTRACT

A preparation method of a semiconductor structure includes: a substrate including a groove structure is provided; a first isolation layer, a second isolation layer and a third isolation layer are sequentially formed on a bottom and sidewalls of the groove structure, where an upper surface of the first isolation layer is lower than an upper surface of the second isolation layer and an upper surface of the substrate to form a side trench; the third isolation layer is etched to enable an upper surface of the third isolation layer to be lower than the upper surface of the second isolation layer so that a top of the second isolation layer protrudes with respect to the first isolation layer and the third isolation layer to form a convex structure; and the second isolation layer is etched to remove the convex structure.

10 Claims, 15 Drawing Sheets

(51) Int. Cl.
*H10D 30/69* (2025.01)
*H10D 62/10* (2025.01)
*H10D 64/68* (2025.01)
*H10D 84/01* (2025.01)
*H10D 84/03* (2025.01)
*H10D 84/85* (2025.01)

(56) References Cited

U.S. PATENT DOCUMENTS

| | | | |
|---|---|---|---|
| 6,093,600 A * | 7/2000 | Chen | H10B 12/033 |
| | | | 257/E21.59 |
| 6,352,897 B1 | 3/2002 | Sung | |
| 6,452,246 B1 | 9/2002 | Komori | |
| 6,682,986 B2 | 1/2004 | Kim | |
| 6,855,615 B2 | 2/2005 | Komori | |
| 6,939,780 B2 | 9/2005 | Yun | |
| 7,518,210 B2 | 4/2009 | Yun | |
| 7,557,415 B2 | 7/2009 | Youn | |
| 2002/0064912 A1 | 5/2002 | Komori | |
| 2002/0168850 A1 | 11/2002 | Kim | |
| 2002/0190345 A1 | 12/2002 | Komori | |
| 2003/0013271 A1 * | 1/2003 | Knorr | H01L 21/76229 |
| | | | 257/E21.548 |
| 2004/0072408 A1 | 4/2004 | Yun | |
| 2004/0198019 A1 * | 10/2004 | Yasui | H01L 21/76224 |
| | | | 257/E21.546 |
| 2005/0127472 A1 | 6/2005 | Yun | |
| 2006/0121687 A1 * | 6/2006 | Yun | H10D 30/62 |
| | | | 438/438 |
| 2007/0164391 A1 | 7/2007 | Youn | |
| 2009/0289280 A1 | 11/2009 | Zhang | |

FOREIGN PATENT DOCUMENTS

| | | |
|---|---|---|
| CN | 103839868 A | 6/2014 |
| CN | 102263052 B | 6/2015 |
| CN | 112234024 A | 1/2021 |
| CN | 114883243 A | 8/2022 |
| KR | 20030000135 A | 1/2003 |

OTHER PUBLICATIONS

C. Leroux, S. Baudot, M. Charbonnier, ect, "Investigating doping effects on high-K metal gate stack for effective work function engineering", Solid-State Electronics, vol. 88, pp. 21-26(2013), 6 pages.

Xiao Fang, al. "Hot Phosphoric Acid Etch Rate to Si3N4 in Wet Etching", Semiconductor Technology vol. 32 No.10-847(2007), 4 pages.

* cited by examiner

SEMICONDUCTOR STRUCTURE AND PREPARATION METHOD OF SEMICONDUCTOR STRUCTURE

CROSS-REFERENCE TO RELATED APPLICATION

This application claims priority to Chinese Patent Application No. 202210082266.X, filed on Jan. 24, 2022, the disclosure of which is hereby incorporated herein by reference in its entirety.

BACKGROUND

In manufacturing of integrated circuits, tens of thousands of active devices (such as a Positive-channel-Metal-Oxide-Semiconductor (PMOS) transistor and a Negative-channel-Metal-Oxide-Semiconductor (NMOS) transistor) are integrated on substrate materials simultaneously. In order to prevent devices from influencing each other, it is necessary to adopt isolation technology to isolate each active device from its adjacent device.

However, the current isolation technology still has some shortcomings, and how to optimize the isolation effect is an urgent technical problem to be solved at this stage.

SUMMARY

The present disclosure relates to the technical field of semiconductors, and in particular to, a semiconductor structure and a preparation method of the semiconductor structure.

Embodiments of the present disclosure provide a preparation method of a semiconductor structure, including: providing a substrate including a groove structure; sequentially forming a first isolation layer, a second isolation layer and a third isolation layer on a bottom and sidewalls of the groove structure, where an upper surface of the first isolation layer is lower than an upper surface of the second isolation layer and an upper surface of the substrate to form a side trench; etching the third isolation layer to enable an upper surface of the third isolation layer to be lower than the upper surface of the second isolation layer so that a top of the second isolation layer protrudes with respect to the first isolation layer and the third isolation layer to form a convex structure; and etching the second isolation layer to remove the convex structure.

Embodiments of the present disclosure also provide a semiconductor structure, including: a substrate including a groove structure; and an isolation dielectric, filled in the groove structure and sequentially including a first isolation layer, a second isolation layer and a third isolation layer covering a bottom surface and sidewalls of the groove structure, where an upper surface of the isolation dielectric is lower than an upper surface of the substrate, and an upper surface of the first isolation layer is flush with an upper surface of the second isolation layer.

Additional aspects and advantages of the present disclosure will be set forth in the following description, which will become clear from the following description or will become known through the practice of the present disclosure.

BRIEF DESCRIPTION OF THE DRAWINGS

In order to describe the technical solutions of the embodiments of the present disclosure or the technical solution in the conventional technique more clearly, drawings required to be used in the embodiments of the present disclosure will be briefly introduced below. Apparently, the drawings described below are only some embodiments of the present disclosure. Those of ordinary skill in the art also can obtain other drawings according to these drawings without doing creative work.

REFERENCE NUMERALS

Figure 1:
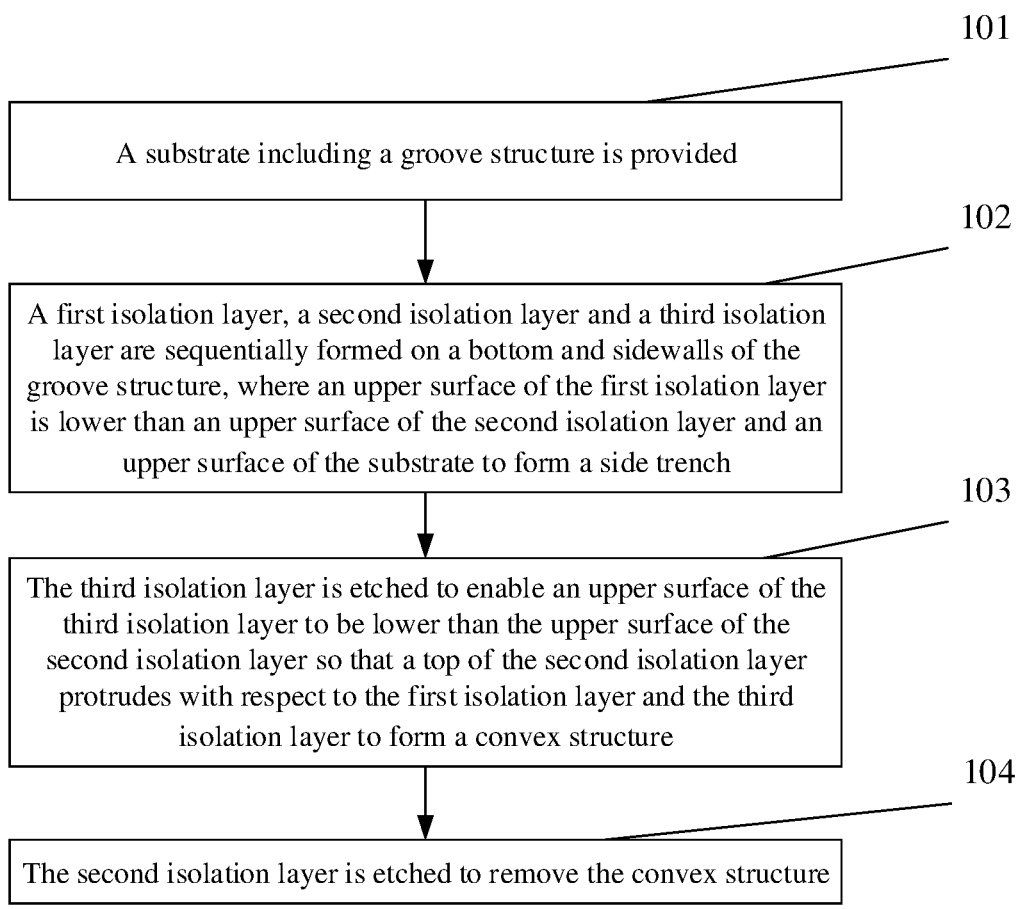
FIG. 1 is a flowchart of a preparation method of a semiconductor structure according to an embodiment of the present disclosure.

201—substrate; 203—groove structure; 204—isolation dielectric; 205—first isolation layer; 207—second isolation layer; 209—third isolation layer; 211—side trench; 213—first oxide layer; 214—silicon nitride layer; 215—second oxide layer; 216—third oxide layer; 217—silicon germanium layer; 219—convex structure; 221—protective layer; 223—interface layer; 225—high-K dielectric layer; 227—titanium nitride; 229—alumina; 231—lanthanum oxide; 233—first gate stack; 235—second gate stack.

DETAILED DESCRIPTION

Exemplary implementations of the disclosure will be described below more comprehensively with reference to the drawings. Although the exemplary implementations of the disclosure are shown in the drawings, it should be understood that, the disclosure may be implemented in various forms and should not be limited by the specific implementations elaborated herein. On the contrary, these implementations are provided to enable a more thorough understanding of the disclosure and to fully convey the scope of the disclosure to those skilled in the art.

In the drawings, the sizes of layers, areas and elements and their relative sizes may be exaggerated for clarity. The same drawing signs represent the same elements throughout.

It is to be understood that description that an element or layer is "above", "adjacent to", "connected to", or "coupled to" another element or layer may refer to that the element or layer is directly above, adjacent to, connected to or coupled to the other element or layer, or there may be an intermediate element or layer. On the contrary, description that an element is "directly on", "directly adjacent to", "directly connected to" or "directly coupled to" another element or layer refers to that there is no intermediate element or layer. It is to be understood that, although various elements, components, areas, layers and/or parts may be described with terms "first", "second", "third", etc., these elements, components, areas, layers and/or parts should not be limited to these terms. These terms are used only to distinguish one element, component, area, layer or part from another element, component, area, layer or part. Therefore, a first element, component, area, layer or part discussed below may be represented as a second element, component, area, layer or part without departing from the teaching of the disclosure. However, when the second element, component, area, layer or part is discussed, it does not mean that the first element, component, area, layer or part must exist in the disclosure.

In order to conveniently describe, spatially relational terms such as "below", "under", "lower", "beneath", "above", and "upper" may be used herein for describing a relationship between one element or feature and another element or feature illustrated in the figure. It is to be understood that, in addition to the orientation shown in the figures, the spatially relational terms are intended to further include different orientations of devices in use and operation. For example, if the devices in the figures are turned over, elements or features described as being "under" or "beneath" or "below" other elements or features will be oriented to be "on" the other elements or features. Therefore, the exemplary terms "under" and "below" may include both upper and lower orientations. The device may include otherwise orientation (rotation by 90 degrees or in other orientations) and the spatial descriptors used herein may be interpreted accordingly.

The terms used herein are intended only to describe specific embodiments and are not a limitation of the disclosure. As used herein, singular forms "a/an", "one", and "the" may also be intended to include the plural forms, unless otherwise specified forms in the context. It is also to be understood that, when terms "composed of" and/or "including" are used in this specification, the presence of the features, integers, steps, operations, elements, and/or components may be determined, but the presence or addition of one or more other features, integers, steps, operations, elements, components, and/or groups is also possible. As used herein, term "and/or" includes any and all combinations of the related listed items.

With the development of Moore's Law, the shallow trench isolation (STI) technology has been widely used to fabricate insulation structures between active regions. Due to technological limitations, a region of the STI structure adjacent to the active region is easy to sag to form a side trench. The formation of a semiconductor device on the substrate with the side trench is easy to generate parasitic current, which affects the electrical characteristics of the semiconductor device, and the existence of the side trench will make the subsequent process of forming semiconductor device more difficult, for example, the deposited conductive layer breaks, resulting in the failure of semiconductor device.

Based on this, the embodiments of the present disclosure provide a preparation method of a semiconductor structure, with reference to FIG. 1, the method includes operations 101 to 104.

In operation 101, a substrate including a groove structure is provided.

In operation 102, a first isolation layer, a second isolation layer and a third isolation layer are sequentially formed on a bottom and sidewalls of the groove structure, where an upper surface of the first isolation layer is lower than an upper surface of the second isolation layer and an upper surface of the substrate to form a side trench.

In operation 103, the third isolation layer is etched to enable an upper surface of the third isolation layer to be lower than the upper surface of the second isolation layer so that a top of the second isolation layer protrudes with respect to the first isolation layer and the third isolation layer to form a convex structure.

In operation 104: the second isolation layer is etched to remove the convex structure.

According to the present disclosure, the convex structure of the second isolation layer is formed by etching the third isolation layer, and then the convex structure is removed by etching, so that the side trench is removed to avoid the influence from the side trench on the electrical characteristics of the device, and simultaneously the process difficulty of subsequent metal wiring and film deposition is reduced.

The preparation method of the semiconductor structure provided by the embodiments of the present disclosure will be described in detail below with references to FIG. 2A-FIG. 2M.

Figure 2A:
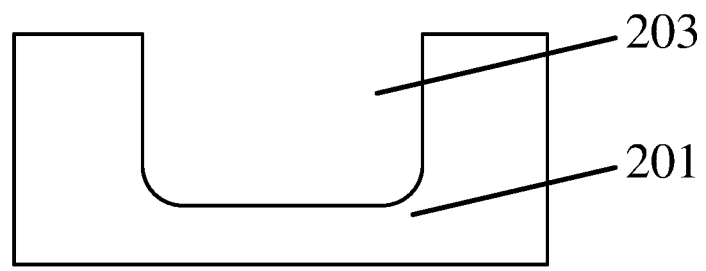
FIG. 2A to FIG. 2M are schematic structural diagrams of a semiconductor structure during preparation according to an embodiment of the present disclosure.

The operation 101 is performed firstly, and as shown in FIG. 2A, a substrate 201 including a groove structure 203 is provided. The substrate 201 includes but is not limited to silicon, silicon germanium, germanium, silicon on insulator (SOI), stacked silicon on insulator (SSOI), or other suitable semiconductor substrate. The groove structure 203 may be formed by, for example, basically isolating the active region of the device through a photolithography process and etching process. In some embodiments, the sidewalls and a bottom surface of the grooved structure have smooth corners, which is helpful to improve the quality of filling and electrical characteristics of the isolation structure.

The operation 102 is then performed, and with references to FIG. 2B to FIG. 2E, the first isolation layer 205, the second isolation layer 207, and the third isolation layer 209 are sequentially formed on the bottom and sidewalls of the groove structure 203, where the upper surface of the first isolation layer 205 is lower than an upper surface of the second isolation layer 207 and the upper surface of the substrate 201 to form a side trench 211.

Figure 2B:
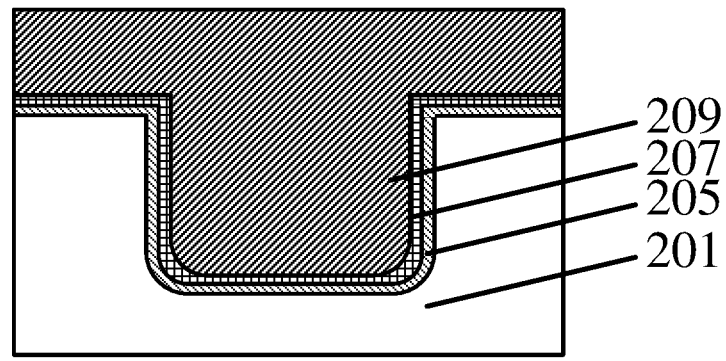
Figure 2C:
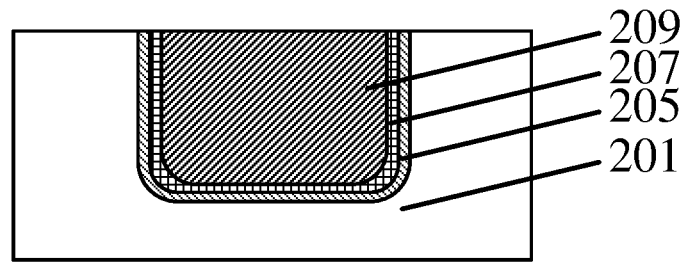

In some embodiments, with references to FIG. 2B to FIG. 2c, the operation that the first isolation layer 205, the second isolation layer 207, and the third isolation layer 209 are sequentially formed on the bottom and sidewalls of the groove structure 203 includes: the first isolation layer 205, the second isolation layer 207, and the third isolation layer 209 are sequentially deposited on the substrate; and the first isolation layer 205, the second isolation layer 207, and the third isolation layer 209 are planarized with the surface of the substrate as a stop layer.

Specifically, firstly, as shown in FIG. 2B, the first isolation layer 205, the second isolation layer 207 and the third isolation layer 209 are sequentially deposited on the substrate. The material of the first isolation layer 205 may exemplarily be an oxide material, for example, silicon oxide. In practice, the oxide material can be produced by oxidation process, and a layer of oxide can be grown by the principle of thermal oxidation. The first isolation layer 205 mainly serves to directly protect the active region while repairing the damage of the etched surface of the groove on the substrate. The material of the second isolation layer 207 may exemplarily be a nitride material, for example, silicon nitride. In practice, a Low Pressure Chemical Vapor Deposition (LPCVD) method can be adopted, and ammonia gas and silicon tetrachloride are introduced to form a layer of silicon nitride on the first isolation layer 205. The material of the third isolation layer 209 may exemplarily be an insulation dielectric, for example, an oxide. In practice, a wet oxidation process, a dry oxidation process or a Spin-on Dielectrics (SOD) process can be adopted, the SOD process has the advantages of good insulation performance and strong hole filling ability. The grooves between microelectronic circuits are filled with the SOD, so that the space occupied by the isolation area can be reduced on the premise of keeping the device performance unchanged, the technical process of high-density circuits can be implemented and the circuit efficiency can be improved.

Next, as shown in FIG. 2C, the first isolation layer 205, the second isolation layer 207 and the third isolation layer 209 are flattened. The flattening process may be, for example, Chemical Mechanical Polishing (CMP). Herein, the substrate plane may serve as a stop layer for the CMP process.

Figure 2D:
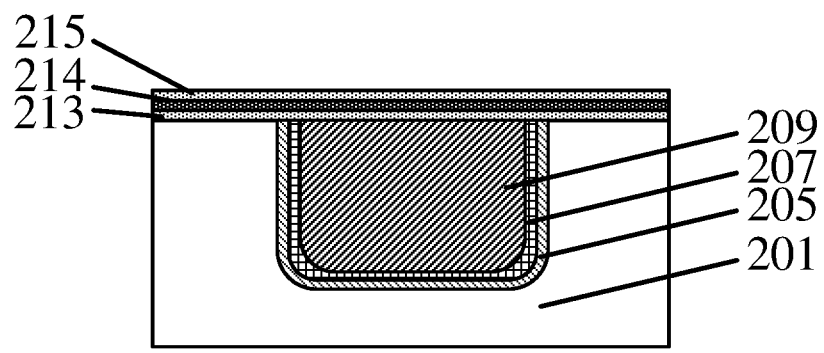

In some embodiments, as shown in FIG. 2D, after the first isolation layer, the second isolation layer, and the third isolation layer are formed, the preparation method further includes: a mask layer is formed on the substrate. The mask layer is a structure including a stack of layers of a first oxide layer 213, a silicon nitride layer 214, and a second oxide layer 215. The mask is used for protecting other regions of the substrate, for example, in a semiconductor memory device including a core region and a peripheral region, the mask is used for protecting the elements in the core region from being affected by the subsequent processes of the peripheral region. Specifically, the operation of forming the first oxide layer 213, the silicon nitride layer 214, and the second oxide layer 215 is performed before the process of growing a gate in the peripheral region.

Figure 2E:
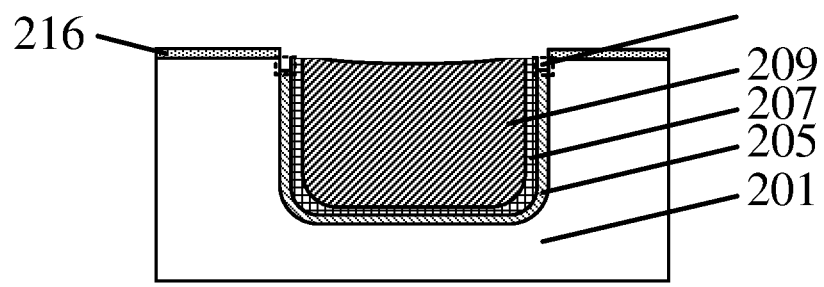
Figure 2F:
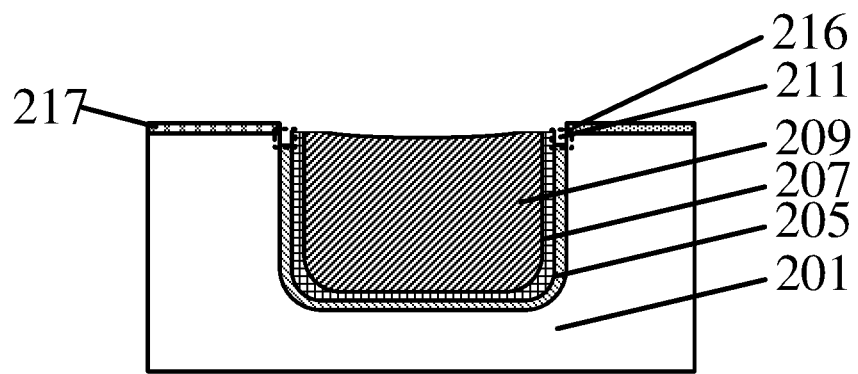
Figure 2G:
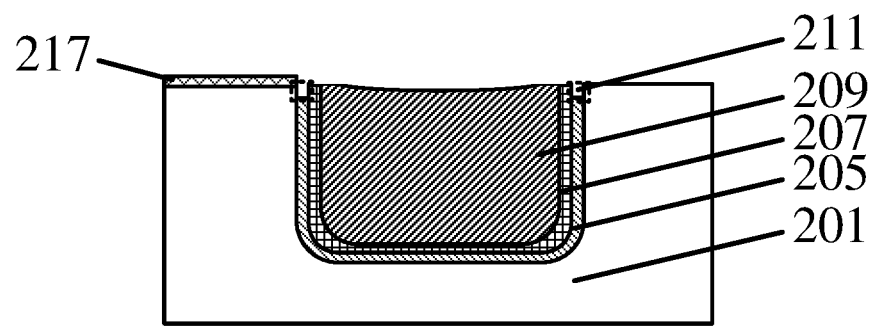

In some embodiments, as shown in FIG. 2E to FIG. 2G, after the first isolation layer, the second isolation layer and the third isolation layer are formed, the preparation method further includes: a silicon-germanium (SiGe) layer 217 is formed on a surface of the substrate that is on one side of the groove structure. The SiGe layer is used for forming a channel of the PMOS transistor, the stress mechanism of the SiGe layer can greatly improve the driving current, and the SiGe layer can improve the mobility of channel carriers due to the stress action, which is beneficial to adjusting the threshold voltage.

Specifically, with first reference to FIG. 2E, a third oxide layer 216 is formed on the surfaces of the substrate that are on both sides of the groove structure. The third oxide layer can be formed on the substrate, for example, by a thermal oxidation process. In some specific embodiments, the thickness of the third oxide layer is thick, e.g. 30 nm to 60 nm, such as 32 nm, 42 nm, 55 nm, 58 nm and the like.

With next reference to FIG. 2F, a third oxide layer 216 on a surface of the substrate that is on one side of the groove structure is etched to expose the substrate, and the SiGe layer 217 is formed on the surface of the substrate that is on the side of the groove structure. In practice, the third oxide layer 216 on the side of the groove structure can be removed by the dry etching process or the wet etching process, and the SiGe layer 217 can be deposited by a chemical vapor deposition (CVD), a selection vapor deposition and the like.

In the above processes, during the operations of planarizing the first isolation layer 205, the second isolation layer 207 and the third isolation layer 209 (see FIG. 2C), removing the mask layer, and removing third oxide layer 216 on the surface of the substrate that is on one side of the groove structure, over-etching of the first isolation layer 205 occurs, which causes the lower surface of the first isolation layer 205 to sag, and a side trench 211 (as shown in FIG. 2E) is generated. In particular, because the thickness of the third oxide layer 216 is thick, the depth-width ratio of the side trench will be further increased in the process of removing the third oxide layer 216, which will aggravate the adverse effect of the side trench on the device performance. The side trench generated in the above operations will be eliminated or improved in the subsequent process operations, thus reducing the adverse effect of the side trench.

After the SiGe layer 217 is generated, with reference to FIG. 2G, the third oxide layer 216 on the surface of the substrate on the other side of the groove structure is etched away to expose the substrate in preparation for subsequent deposition of the high-K dielectric layer and gate stack.

Figure 2H:
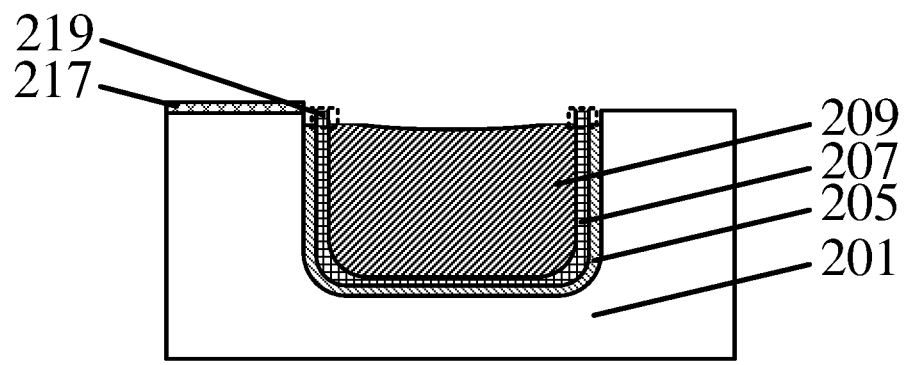

The operation 103 is next performed, as shown in FIG. 2H, the third isolation layer 209 is etched to enable the upper surface of the third isolation layer to be lower than the upper surface of the second isolation layer so that a top of the second isolation layer 207 protrudes with respect to the first isolation layer 205 and the third isolation layer 209 to form a convex structure. By etching the third isolation layer 209, the second isolation layer is completely exposed to form the convex structure 219, so that the area of the surface of the second isolation layer that is in contact with the outside world is increased, the height of the upper surface of the second isolation layer is reduced conveniently, efficiently and uniformly, an etching rate for etching the second isolation layer is easily controlled, and the over-etching occurred on the second isolation layer is not easily caused. Simultaneously, the height of the surface of the third isolation layer is reduced, so that the surface of the isolation dielectric filled in the groove is flatter.

In some embodiments, the third isolation layer is etched by adopting a gas etching process, where a gas used in the gas etching process includes hydrogen and oxygen. Specifically, a sample can be putted into a WET certas machine, and a certain flow of hydrogen and oxygen can be introduced into the machine to implement the etching. Because the gas etching process has less pollution to the substrate and the etching rate of the gas etching process is controllable, a height difference between the first isolation layer and the third isolation layer is easy to adjust.

In some embodiments, the operation of etching the third isolation layer further includes enabling the upper surface of the third isolation layer to be flush with the upper surface of the first isolation layer. After the convex structure is removed, the surface of the isolation dielectric composed of the first isolation layer, the second isolation layer and the third isolation layer can be flatter, and the process difficulty for depositing the high-K dielectric layer and forming the gate stack can be reduced. Since the opening on the first isolation layer 205 is narrow, and the first isolation layer is difficult to be etched by the etching gas, so the etching rate for etching the third isolation layer is higher than the etching rate for etching the first isolation layer. By controlling the etching time and other parameters, the upper surface of the first isolation layer subjected to the etching is flush with an upper surface of the second isolation layer.

Figure 2I:
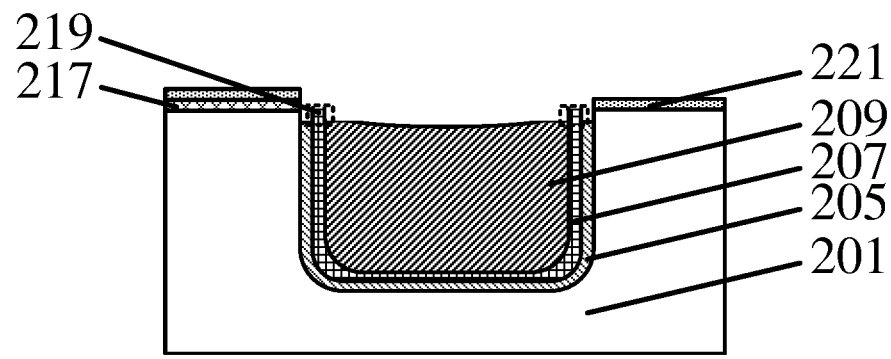
Figure 2J:
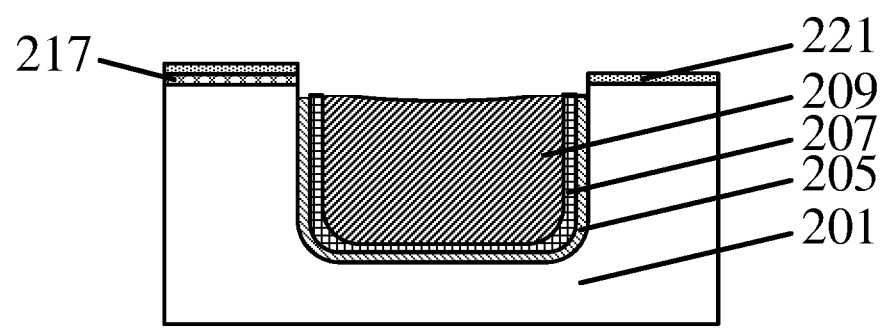

The operation 104 is finally performed, with references to FIG. 2I to FIG. 2J, the second isolation layer 207 is etched to remove the convex structure 219.

In some embodiments, the operation of etching the second isolation layer 207 to remove the convex structure 219 includes: the second isolation layer 207 is etched by adopting the wet etching process, where a wet etching agent of the wet etching process includes phosphoric acid. The wet etching process has advantages of simple operation, low equipment requirements and easy to realize mass production. Exemplarily, when the material of the second isolation layer is silicon nitride, the method of etching the second isolation layer by adopting the phosphoric acid has advantages of good uniformity and high etching selectivity ratio, and small influence on the first isolation layer and the third isolation layer when the convex structure 219 is removed. In practice, a temperature of the wet etching process is controlled to be between 155 degrees Celsius and 165 degrees Celsius, for example, 157 degrees Celsius, 162 degrees Celsius. If the temperature of the wet etching process is too low, the etching efficiency will be reduced or the second isolation layer will be removed incompletely, and if the temperature of the wet etching process is too high, the over-etching may be caused.

In some embodiments, process parameters for etching the second isolation layer 207 are controlled to enable the upper surface of the second isolation layer 207 is flush with the upper surfaces of the first isolation layer 205 and the third isolation layer 209. The upper surface of the first isolation layer is set to be flush with the upper surfaces of the second isolation layer and the third isolation layer, thereby reducing the process difficulty of subsequent metal wiring and film deposition.

In some embodiments, as shown in FIG. 2I, after the third isolation layer 209 is etched, the preparation method further includes: a protective layer 221 is formed on a surface of the silicon-germanium layer 217 and on a surface of the substrate that is on the other side of the groove structure. The material of the protective layer may exemplarily be an oxide material, for example, silicon oxide. In actual operation, the substrate can be putted into a high-temperature pure oxygen device, a certain amount of pure oxygen can be introduced, and a thermal oxide layer can be formed on the surface of the silicon-germanium layer 217 and on the surface of the substrate that is on the other side of the groove structure by high-temperature oxidation, and the thickness of the thermal oxide layer can be, for example, 2 nm to 3 nm. In the subsequent process of etching the second isolation layer by phosphoric acid, the protective layer can protect the silicon-germanium layer and the substrate and protect the channel area by preventing phosphoric acid from polluting the substrate.

Figure 2K:
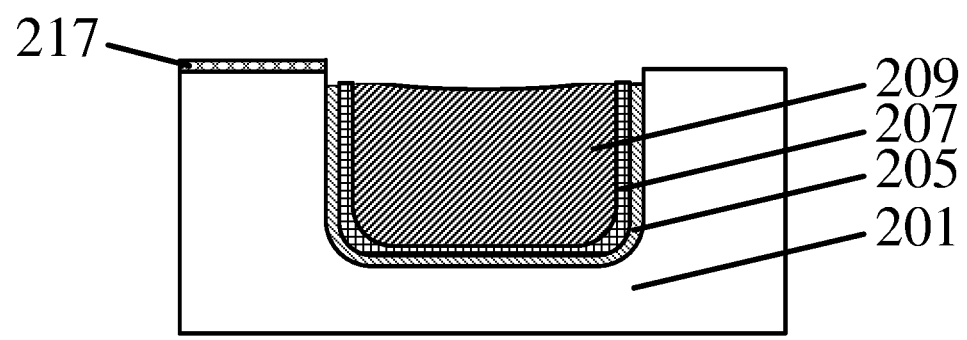

In some embodiments, as shown in FIG. 2K, after the second isolation layer 207 is etched, the preparation method further includes: the protective layer 221 is removed. The protective layer is removed and the channel region is exposed, to prepare for subsequently depositing the high-K dielectric layer and forming the gate stack. In practice, the protective layer is removed by adopting a hydrofluoric acid solution. The method of etching the protective layer formed by the oxide material by the hydrofluoric acid has advantages of good uniformity and high etching selectivity ratio.

Figure 2L:
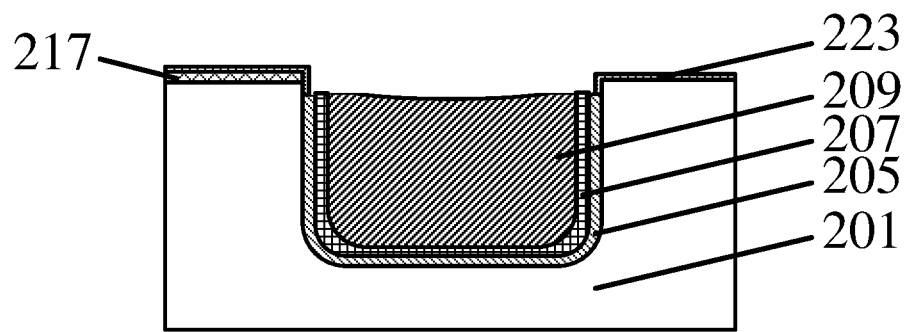
Figure 2M:
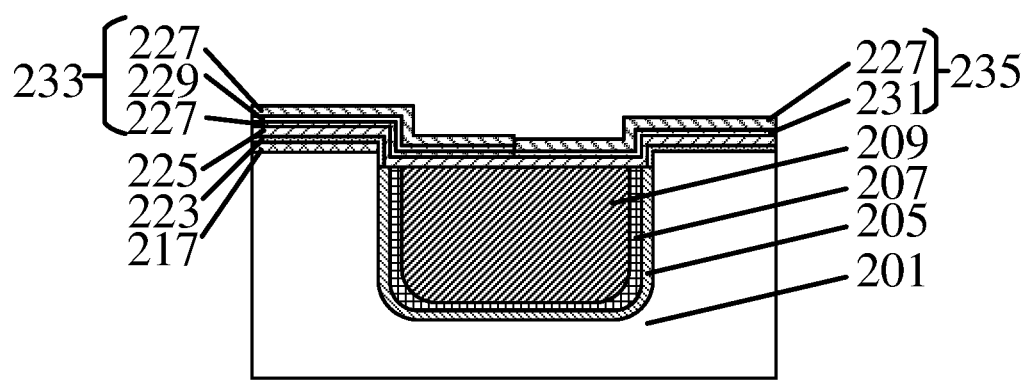

In some embodiments, as shown in FIG. 2L to FIG. 2M, after the protective layer is removed, the preparation method further includes: a high-K dielectric layer 225 is deposited on the substrate; and a first gate stack 233 is formed on a high-K dielectric layer 225 on one side of the groove structure where the silicon-germanium layer is formed, and a second gate stack 235 is formed on a high-K dielectric layer on the other side of the groove structure, where a material of the first gate stack 233 is different from a material of the second gate stack 235. The material of the high-K dielectric layer 225 may include, but is not limited to, BaZrO, HfZrO, HfZrON, HfLaO, HfSiON, HfSiO, LaSiO, AlSiO, HfTaO, HfTiO, (Ba, Sr) TiO$_3$ (BST), Al$_2$O$_3$, La$_2$O$_3$, Si$_3$N$_4$, nitrogen oxides or other suitable materials. A suitable process such as CVD, Atomic Layer Deposition (ALD) or Physical Vapor Deposition (PVD) may be used for forming the high-K dielectric layer 225. The thickness of the high-K dielectric layer 225 may range from 2 nm to 10 nm. High-K Metal Gate (HKMG) technology is applied to reduce the Equivalent Oxide Thickness (EOT) of device, greatly reduce the leakage of gate, and realize the high performance requirement of reducing the leakage. In practice, the first gate stack 233 is a structure including a stack of layers of titanium nitride 227, alumina 229 and titanium nitride 227, and the second gate stack 235 is a structure including a stack of layers of lanthanum oxide 231 and titanium nitride 227. Specifically, for example, the second gate stack can be deposited on the high-K dielectric layer, and then the second gate stack on a high-K dielectric layer on one side of the groove structure where the silicon-germanium layer is formed can be removed by mask etching, and then the first gate stack can be deposited. In other embodiments, a patterned first mask layer may be used for blocking one side; titanium nitride and alumina are sequentially deposited on the high-K dielectric layer on the side where the silicon-germanium layer is formed; then, the first mask layer is removed; a second mask layer is formed on stack of layers of the titanium nitride and alumina; lanthanum oxide is formed on the high-K dielectric layer on the other side of the groove structure; the second mask layer is removed; and titanium nitride is deposited on the alumina and lanthanum oxide simultaneously. In this way, the first gate stack and the second gate stack can be formed. By adopting different materials of the gate stacks, the performance parameters of the PMOS transistor and the NMOS transistor are controllable, a value of the work function of the gate materials can be freely set and adjusted, and the threshold voltage can be fully controlled.

In some embodiments, as shown in FIG. 2L, before the high-K dielectric layer 225 is deposited on the substrate, the preparation method further includes: an interface layer (IL) 223 is formed on the surface of the silicon-germanium layer 217 and on the surface of the substrate that is on the other side of the groove structure. The interface layer 223 may be a thermal oxide layer, an oxide layer of nitrogen, a chemical oxide layer or other suitable thin film layer. A suitable process such as CVD, ALD or PVD can be used for forming the interface layer, for example, the interface layer can be formed by thermal oxidation using the high temperature pure oxygen. The thickness of the interface layer may range from 0.8 nm to 1.5 nm, for example, 1 nm. The interface layer can increase the adhesion between the high-K dielectric layer and the substrate or silicon-germanium layer, and has a function of preventing leakage.

In some embodiments, a PMOS transistor is formed on the side of the groove structure where the silicon-germanium layer is formed, and a NMOS transistor is formed on the other side of the groove structure. In practice, PMOS transistor can be formed firstly and then the NMOS transistor is formed, or the NMOS transistor can be formed firstly and then PMOS transistor is formed. In this way, a Complementary Metal Oxide Semiconductor (CMOS) integrated circuit is composed of the PMOS transistor and the NMOS transistor. Metal atoms in the PMOS transistor form the dipole at an interface between high-K dielectric layer and IL, and the dipole and the SiGe structure act as the channel, which can effectively adjust the threshold voltage of the PMOS transistor. On the other hand, due to the elimination of the side trench, discontinuous fracture and channel surface damage of device will not occur in the subsequent process of growing the high-K dielectric layer and work function metal, thus the drift and instability of CMOS performance can be avoided.

Figure 3:
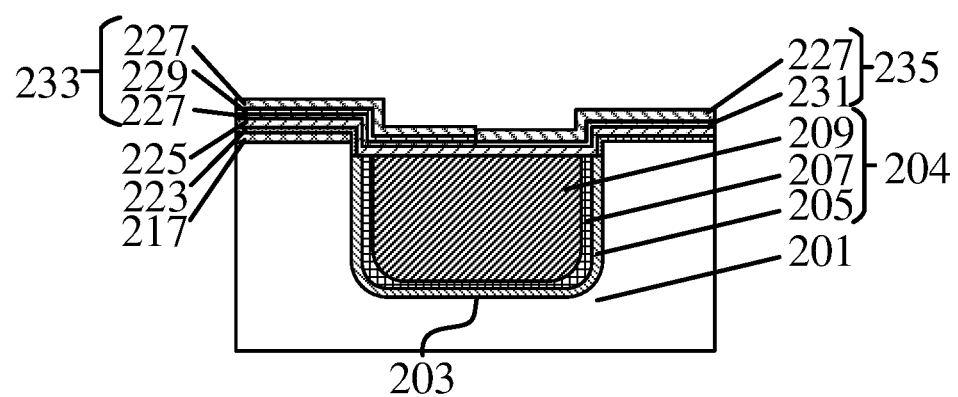
FIG. 3 is a cross-sectional schematic diagram of a semiconductor structure according to an embodiment of the present disclosure.

Embodiments of the present disclosure also provide a semiconductor structure, as shown in FIG. 3, the semiconductor structure includes: a substrate 201 including a groove structure 203; and an isolation dielectric 204 filled in the groove structure 203 and sequentially including a first isolation layer 205, a second isolation layer 207, and a third isolation layer 209 covering a bottom surface and sidewalls of the groove structure 203. An upper surface of the isolation dielectric 204 is lower than an upper surface of the substrate 201, and an upper surface of the first isolation layer 205 is flush with an upper surface of the second isolation layer 207. Since the upper surface of the first isolation layer 205 is flush with the upper surface of the second isolation layer 207, there is no side trench, which avoids the influence of the side trench on the electrical characteristics of the device, and simultaneously reduces the difficulties of subsequent processes, such as cleaning, metal wiring and film deposition.

In some embodiments, the upper surfaces of the first isolation layer 205 and the second isolation layer 207 are flush with an upper surface of the third isolation layer 209. In this way, the surface of the isolation dielectric is flatter, and the process difficulties of depositing the high-K dielectric layer and forming the gate stack can be reduced.

In some embodiments, as shown in FIG. 3, the semiconductor structure further includes a silicon-germanium layer 217 disposed on a surface of the substrate that is on one side of the groove structure 203. The silicon-germanium layer is used for forming a channel of the PMOS transistor, the stress mechanism of the silicon-germanium layer can greatly improve the driving current, and the silicon-germanium layer can improve the mobility of channel carriers due to the stress action, which is beneficial to adjusting the threshold voltage. In practice, the silicon-germanium layer can be selectively grown by Epitaxy (EPI) growth.

In some embodiments, as shown in FIG. 3, the semiconductor structure further includes an interface layer 223 on the surface of the silicon-germanium layer 217 and on the surface of the substrate that is on the other side of the groove structure. The interface layer 223 may be a thermal oxide layer an oxide layer of nitrogen, a chemical oxide layer or other suitable thin film layer. A suitable process such as CVD, ALD or PVD can be used for forming the interface layer, for example, the interface layer can be formed by thermal oxidation using the high temperature pure oxygen. The thickness of the interface layer may range from 0.8 nm to 1.5 nm, for example, 1 nm. The interface layer can increase the adhesion between the high-K dielectric layer and the substrate or silicon-germanium layer, and has a function of preventing leakage.

In some embodiments, the semiconductor structure further includes: a PMOS transistor disposed on one side of the groove structure, and a channel of the PMOS transistor includes the silicon-germanium layer; and an NMOS transistor disposed on the other side of the groove structure. In this way, a CMOS integrated circuit is composed of the PMOS transistor and the NMOS transistor. Metal atoms in the PMOS transistor form the dipole at an interface between high-K dielectric layer and IL, and the dipole combined and the SiGe structure act as the channel, which can effectively adjust the threshold voltage of the PMOS transistor. On the other hand, due to the elimination of the side trench, discontinuous fracture and channel surface damage of device will not occur in the subsequent process of growing the high-K dielectric layer and work function metal, thus the drift and instability of CMOS performance can be avoided.

To sum up, according to the present disclosure, the convex structure of the second isolation layer is formed by etching the third isolation layer, and then the convex structure is removed by etching, so that the side trench is removed to avoid the influence of the side trench on the electrical characteristics of the device, and simultaneously the process difficulty of subsequent metal wiring and film deposition is reduced.

It should be noted that the semiconductor structure and the preparation method of the semiconductor structure provided by the embodiments of the present disclosure can be applied to any integrated circuit including the structure. In the technical scheme described in each embodiment, the technical features can be arbitrarily combined without conflict. Those skilled in the art can transform the operation sequence of the preparation method without leaving the protection scope of the present disclosure. Under the condition that the operations in the embodiment of the present disclosure do not conflict, a part of the operations can be performed simultaneously or can be invoked to perform in sequence.

The above is only preferred embodiments of the present disclosure, and the scope of protection of the present disclosure is not limited to this. Any modification, equivalent replacement and improvement made within the spirit and principles of the present disclosure should be included in the scope of protection of the present disclosure.

The invention claimed is:

1. A preparation method of a semiconductor structure, comprising:
   providing a substrate comprising a groove structure;
   sequentially forming a first isolation layer, a second isolation layer and a third isolation layer on a bottom and sidewalls of the groove structure, wherein an upper surface of the first isolation layer is lower than an upper surface of the second isolation layer and an upper surface of the substrate to form a side trench;
   etching the third isolation layer to enable an upper surface of the third isolation layer to be lower than the upper surface of the second isolation layer so that a top of the second isolation layer protrudes with respect to the first isolation layer and the third isolation layer to form a convex structure;
   etching the second isolation layer to remove the convex structure;
   after forming the first isolation layer, the second isolation layer and the third isolation layer,
   forming a silicon-germanium layer on a surface of the substrate that is on one side of the groove structure; and
   after etching the third isolation layer,
   forming a protective layer on a surface of the silicon-germanium layer and on a surface of the substrate that is on the other side of the groove structure; and
   after etching the second isolation layer,
   removing the protective layer.

2. The preparation method of claim 1, wherein etching the second isolation layer to remove the convex structure comprises:
   etching the second isolation layer by adopting a wet etching process, wherein a wet etching agent of the wet etching process comprises phosphoric acid.

3. The preparation method of claim 2, wherein a temperature of the wet etching process is controlled to be between 155 degrees Celsius and 165 degrees Celsius.

4. The preparation method of claim 1, wherein etching the third isolation layer comprises:
   etching the third isolation layer by adopting a gas etching process, wherein a gas used in the gas etching process comprises hydrogen and oxygen.

5. The preparation method of claim 1, wherein etching the third isolation layer further comprises:
   enabling the upper surface of the third isolation layer to be flush with the upper surface of the first isolation layer.

6. The preparation method of claim 1 wherein:
   the protective layer is removed by adopting a hydrofluoric acid solution.

7. The preparation method of claim 1 further comprising:
   after removing the protective layer,
   depositing a high-K dielectric layer on the substrate; and
   forming a first gate stack on a high-K dielectric layer on one side of the groove structure where the silicon-germanium layer is formed, and forming a second gate stack on a high-K dielectric layer on the other side of the groove structure, wherein a material of the first gate stack is different from a material of the second gate stack.

8. The preparation method of claim 7, wherein:
the first gate stack is a structure comprising a stack of layers of titanium nitride, alumina and titanium nitride, and the second gate stack is a structure comprising a stack of layers of lanthanum oxide and titanium nitride.

9. The preparation method of claim 7, further comprising, before depositing the high-K dielectric layer on the substrate,
forming an interface layer on the surface of the silicon-germanium layer and on the surface of the substrate that is on the other side of the groove structure.

10. The preparation method of claim 1 wherein a Positive-channel-Metal-Oxide-Semiconductor (PMOS) transistor is formed on the side of the groove structure where the silicon-germanium layer is formed, and a Negative-channel-Metal-Oxide-Semiconductor (NMOS) transistor is formed on the other side of the groove structure.

* * * * *